United States Patent [19]

Chakravarti et al.

[11] Patent Number: 4,542,340

[45] Date of Patent: Sep. 17, 1985

[54] TESTING METHOD AND STRUCTURE FOR LEAKAGE CURRENT CHARACTERIZATION IN THE MANUFACTURE OF DYNAMIC RAM CELLS

[75] Inventors: Satya N. Chakravarti, Hopewell Junction, N.Y.; Paul L. Garbarino, Ridgefield, Conn.; Donald A. Miller, Fishkill, N.Y.

[73] Assignee: IBM Corporation, Hopewell Junction, N.Y.

[21] Appl. No.: 454,900

[22] Filed: Dec. 30, 1982

[51] Int. Cl.$^4$ .................. G01R 31/26; G01R 31/00
[52] U.S. Cl. .................. 324/158 R; 29/574; 324/73 R; 324/158 D; 324/158 T
[58] Field of Search .......... 324/158 R, 73 R, 60 C; 29/574; 371/21; 324/158 T, 158 D, 158 SC

[56] References Cited

U.S. PATENT DOCUMENTS 3,387,286  6/1968  Dennard .................. 365/222
3,811,076  5/1974  Smith, Jr. .................. 357/41

OTHER PUBLICATIONS

Beilstein, et al.; "Monitor Circuit ... "; IBM Tech. Dis. Bull.; vol. 19; Aug. 1976; pp. 1000–10001.
Grove, A. S.; Physics and Technology of Semiconductor Devices; John Wiley & Sons, Inc.; 1967; pp. 289–315.

Primary Examiner—Ernest F. Karlsen
Attorney, Agent, or Firm—John F. Ohlandt

[57] ABSTRACT

A testing method and structure for leakage current characterization in the manufacture of dynamic RAM cells; the testing structure includes two large gate-controlled diodes, each diode having a diffused junction which is substantially identical with that of the other diode, the gates of the diodes having different perimeter-to-area ratios, such that when testing is carried out, the leakage current components due to the contribution of the thin oxide area can be isolated from the perimeter-contributed components of the isolating thick oxide; dynamic testing can also be performed and, because of the small area for the test site, an "on chip" amplifier can be provided at the site.

14 Claims, 5 Drawing Figures

TESTING METHOD AND STRUCTURE FOR LEAKAGE CURRENT CHARACTERIZATION IN THE MANUFACTURE OF DYNAMIC RAM CELLS

BACKGROUND OF THE INVENTION

1. Field of the Invention

This invention pertains to integrated circuit manufacture. More particularly, it relates to memory circuits which involve dynamic RAM (random access memory) cells, and especially to a testing method and structure for leakage current characterization in the manufacture of such memory cells.

2. Background Information

It is well known to provide FET (field effect transistor) memories in which the memory or storage cell consists of a capacitor storage element gated by a single FET. For example, commonly assigned U.S. Pat. No. 3,387,286 to Dennard discloses such a memory. The outstanding advantage of the FET memory of Dennard is that the integrated circuit structure can be fabricated, because of the simplicity of the cell, such that the substrate or wafer area required for each cell is extremely small. Consequently, a very large memory, including many cells, can be built on a single substrate. The memory, therefore, can be operated at extremely high speeds. However, the type of storage is not permanent because the stored charge, which defines a memory bit, tends to leak off over time, although the time during which the charge remains at a satisfactory value has been found to be relatively long compared with the read-write cycle time for the memory.

Accordingly, it is of critical importance in the production of such memories to be able to test effectively during the manufacturing process so that the completed cells will be characterized by a minimum time period requirement for periodically regenerating or refreshing their stored information. It will be understood that the time requirement is a function of the inherent leakage characteristic of the memory cell. Moreover, as will be appreciated, leakage currents play a very significant role as the individual cells become very small. An important criterion then in manufacturing such memories or systems is to determine accurately the various components of significant leakage currents that are contributed (1) by material defects or (2) by defects arising due to the nature of the particular process or technology adopted for fabricating these integrated circuit memories.

It is, therefore, a primary object of the present invention to provide a means for precisely determining the individual defects contributing to total leakage current, and for controlling same.

Another reference that may be found useful as background information in connection with the present invention is the integrated circuit structure described in U.S. Pat. No. 3,811,076 assigned to the assignee of the present application. That patent is pertinent because it discloses the notion of forming the capacitor, which is serially connected as the dynamic storage element to an FET, such that one of the capacitor electrodes corresponds with one of the conductivity-type regions of an FET electrode. That patent also discloses a polycrystalline silicon (polysilicon) field shield. Accordingly, this patent provides useful information with regard to the current or conventional method of fabricating field effect transistor memories.

More pertinent to the specific context of testing for leakage currents in integrated circuit memory fabrication is the disclosure in IBM TDB Volume 19, No. 3, August 1976, which describes a monitor circuit for leakage-sensitive FET devices. According to this monitor circuit, a pair of suitably connected FET devices enables measurement of very small leakage currents on standard parametric testers by a charge retention time technique. The described circuit also permits gate diffusion overlap capacitance to be measured; while the leakage distributions per wafer obtained by the described circuit furnishes an indication of the processing line quality.

Nevertheless, despite the teachings of the several references cited, there is nothing disclosed therein which enables the unique results achievable by the present invention to be fulfilled.

Accordingly, it is another primary object of the present invention to provide a method and a testing structure which will permit the characterization and isolation of particular leakage current components that are required to be measured in the process of making integrated circuits and more especially, integrated circuit FET memories.

A specific object is to create a memory diagnostic probe or testing device for separating the area-derived component of leakage from the isolation-bounded perimeter component of leakage in such manufacture.

Another object of the present invention is to provide a testing structure that will fit so-called "kerf" dimensional requirements which is important when the mix between the product and test site chip is low.

It should be explained in connection with the immediately above stated object that it has been proposed heretofore that, rather than taking up the space required for a normal chip for the purposes of testing, a testing site be developed in the kerf region (which is the region destroyed in the dicing operation when the wafer or substrate is cut up into the aforenoted chips). However, heretofore this has been impracticable because with the other testing means or techniques that have been suggested, such as retention time tests and the like, a requirement is imposed that a full-blown sense amplifier be provided on the test site. Consequently, in such a situation the area required becomes prohibitive. Likewise, other varieties of testing techniques have demanded that full-blown sense amplifiers be included as part of the testing device or structure.

Accordingly, it is a further object to provide a testing structure that takes up such a limited amount of area on a chip that on-chip amplification can be provided. Thus, a simple source follower for amplification purposes can be included on the test site, even within the "kerf" dimensions, whereby as much information can be obtained as would be obtained normally from a so-called "gated diode" of much larger area.

A further object is to provide a testing technique that lends itself to computerized analysis in determining and separating leakage current components. A direct result is that a good statistical sample on the wafer is practical with minimal product sacrifice due to lost area.

Still another object is to separate the aforenoted leakage current components on the same device or structure, so that all other variables are controlled but the one of immediate concern. Tests can be made to show the "goodness" of each part in sequence.

It is yet another object of the invention to provide a method and structure that will be a suitable vehicle for measuring other leakage such as bulk diffusion leakage at elevated temperature.

SUMMARY OF THE INVENTION

The above stated and other objects of the invention are fulfilled or implemented by a primary feature of the present invention. This primary feature resides in the provision of a method and means for testing integrated circuits to determine or measure significant leakage currents by (1) isolating or separating the various leakage current components due to material defects from (2) those leakage current components due to process-induced defects. This is accomplished by uniquely forming a symmetrical gated diode structure within the wafer at an appropriate test site thereon. Because of the very small area required, the test site according to the present invention may be formed within the region allotted to sawing the wafer into chips; that is to say, in the "kerf" region.

Rather than the diode structure including a plurality of distinct or individual diodes having different perimeter-to-area ratios, the present invention enables isolating the above mentioned leakage current components by forming at the test site a diffused junction that is common, or is identical, with respect to a number of diode devices to be tested, the gates of which have different perimeter-to-area ratios whereby a minimum area is required for the test site.

A specific feature of the present invention resides in the provision of enabling both (1) gate-controlled diode testing as well as (2) dynamic testing, sometimes called a "pause test" (which studies the time-dependent leakage phenomenon in a RAM cell as a function of perimeter-to-area ratio). In the latter case, there is included at the test site a simple source-follower device such that, as indicated previously, as much information can be obtained as would be obtained normally from a gate-controlled diode structure of much larger area - which structure would have involved a full-blown sense amplifier.

Other and further objects, advantages and features of the present invention will be understood by reference to the following specification in conjunction with the annexed drawing, wherein like parts have been given like numbers.

DESCRIPTION OF PREFERRED EMBODIMENTS

Before proceeding with a detailed description of preferred embodiments of the present invention, it is considered useful to briefly review the context in which the present invention functions.

Dynamic RAM memories are finding application as medium performance, high density memories for very large scale integrated circuit applications. However, due to great improvements in lithographic capabilities, cell dimensions have shrunk considerably and, therefore, the magnitude of the stored charge in each of the memory cells is quite small. It, therefore, becomes increasingly important to understand and to be able to characterize various sources contributing to the leakage of the 1-device memory cell. The net leakage current per unit area $J_L$ under a typical known polysilicon gate inversion store RAM cell can be written as $$J_L = J_{DEP} + J_{SS} + J_{OVLP} + J_{DIFF}(\text{Bulk}) + J_{DIFF}(\text{Field})$$

Where $J_{DEP}$ = Leakage current density due to thermal generation in the depletion region under the storage gate;

$J_{SS}$ = Leakage current density due to generation recombination via surface states in the storage region;

$J_{OVLP}$ = Leakage current density due to bulk and surface-generation in the tapered field oxide region (overlapping the edge of the cell) under the P1 storage gate;

$J_{DIFF}$ (Bulk) = Leakage current density due to diffusion of minority carriers generated in the bulk within a diffusion length of the storage region depletion boundary;

$J_{DIFF}$ (Field) = Leakage current density due to diffusion of minority carriers generated in the depleted region under the thick field oxide (due to oxide charges).

Figure 1:
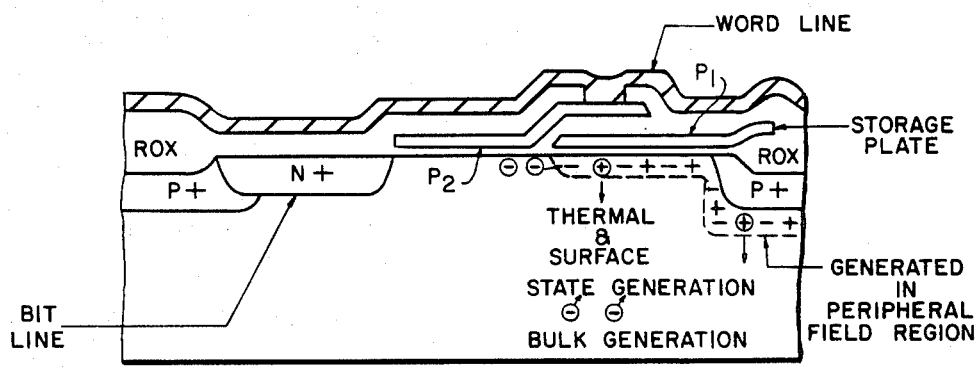
FIG. 1 is a vertical representation of a one-device memory cell fabricated by a known double polysilicon process, such being exemplary of the various leakage generation sites.

Referring to FIG. 1, there is shown a vertical representation of a known one-device dynamic memory cell fabricated by a double layer, polysilicon technique. This representation is merely illustrative of various leakage generation sites; hence it will become apparent that a preferred embodiment to be described, involving a simpler, i.e., single polysilicon layer, structure possesses essentially the same leakage characteristics.

The respective areas of generation of various leakage components are indicated on FIG. 1. It should be pointed out that the peripheral leakage on the tapered field oxide region ($J_{OVLP}$) is strongly dependent on the voltage of the P1 gate electrode seen in FIG. 1, minority carrier lifetime and surface re-combination in and around the so-called "bird beak" region. In the case of a memory cell operating with a high storage plate voltage, the overlap component was found to be four to ten times larger at low temperatures compared to the other leakage components of the cell, such as $J_{DEP}$ and $J_{SS}$.

Another component of leakage which is of utmost importance in gettered silicon wafers and at elevated temperatures is the bulk diffusion leakage. When gettering of impurities of silicon wafers is carried out, the minority carrier bulk lifetime $T_B$ is improved, which subsequently increases the minority carrier diffusion length L. With large $T_B$, the storage region thermal generation component $J_{DEP}$ becomes less significant compared to the bulk diffusion component $J_{DIFF}$(Bulk), since $J_{DEP}$ varies as $1/T_B$ whereas $J_{DIFF}$ (Bulk) is proportional to $1/\sqrt{T_B}$. Also $J_{DIFF}$ (Bulk) has a factor-of-two higher activation energy ($-Eg/KT$) compared to $J_{DEP}$, where Eg is the bandgap of Si, K the Boltzmann's constant and T the absolute temperature. Thus $J_{DIFF}$ (Bulk) leakage becomes more significant for the memory cell at elevated temperature.

The present invention provides a particular embodiment or embodiments of a leakage monitoring test structure which will enable one to experimentally isolate and characterize various sources of leakage in the fabricated memory cells. The tests can be performed at either room or elevated temperatures.

Figure 2:
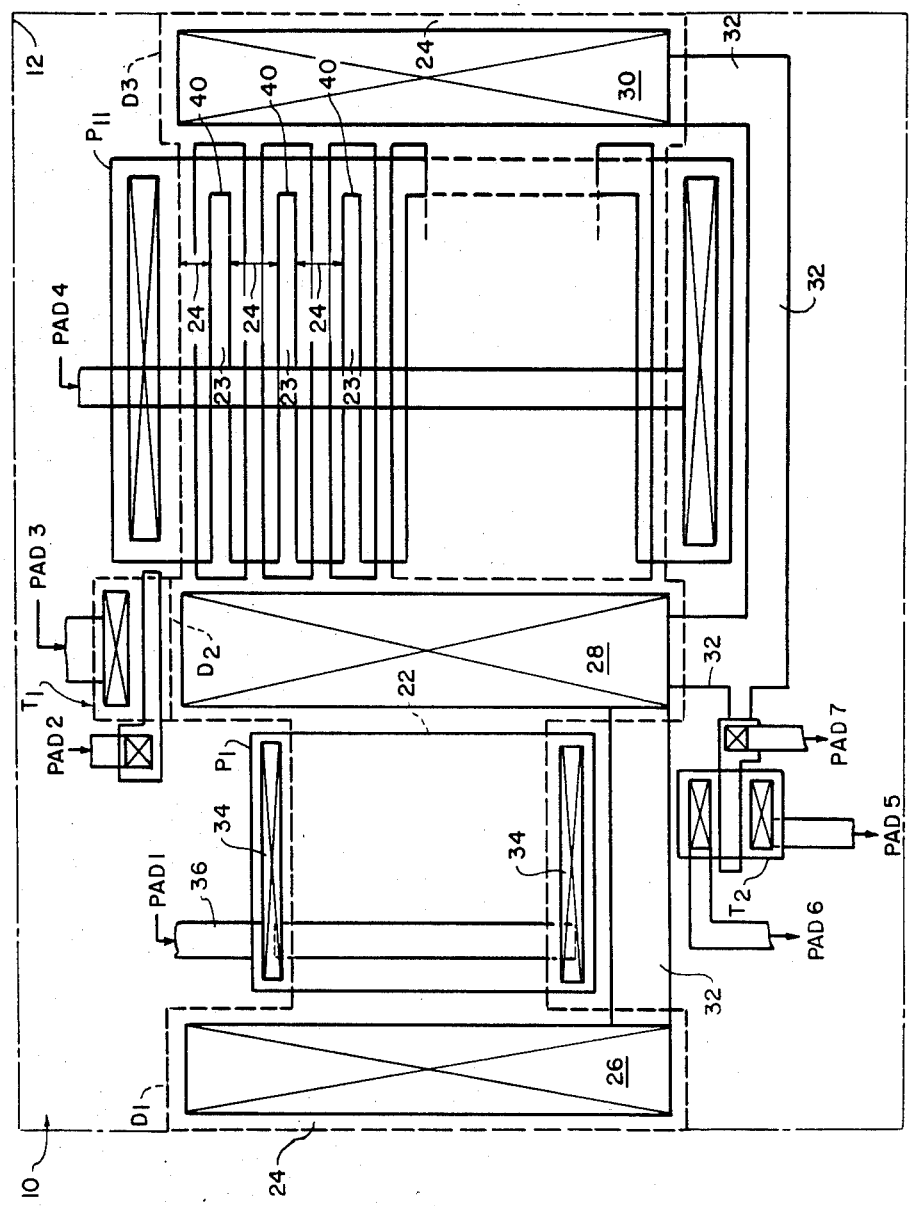
FIG. 2 is a layout of the test site in accordance with a preferred embodiment of the invention.

Referring now to FIG. 2, there will be seen a complete layout for a test site in accordance with the present invention. A leakage monitoring or testing structure 10 is created at this testing site on a portion 12 of a semiconductor wafer which is destined to have a vast number of devices formed in it. Thus, the formation of the leakage testing structure requires no special operations. In other words, such formation is combined with regular diffusion steps that are performed for creating source and drain electrodes for the vast number of memory cells being formed. It will be understood that individual gates of polysilicon are conventionally formed as integral parts of these RAM FET cells. Accordingly, no separate masking is required, nor are additional steps needed to form this testing structure 10. Moreover, as has been mentioned previously, the test site may be laid out suitably in the so-called "kerf" region and hence not be wasteful of any normal chip sites.

Figure 3:
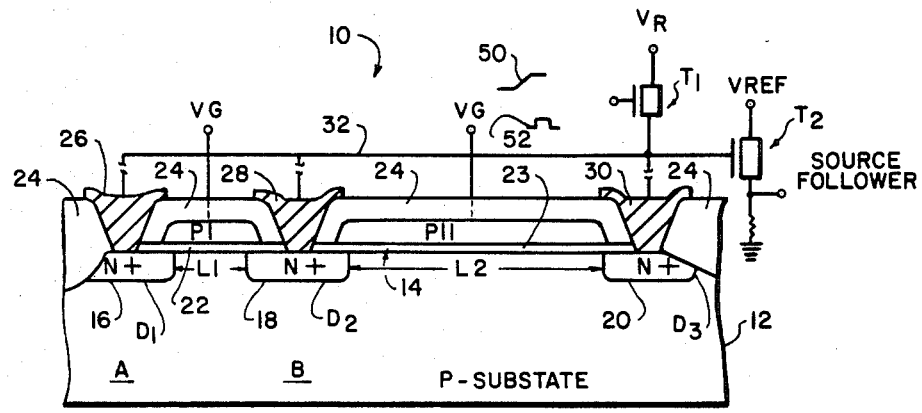
FIG. 3 is a schematic diagram for the preferred embodiment of the invention, including a vertical partial representation in the channel direction of the wafer structure previously seen in FIG. 2.

Referring to FIG. 3, a schematic diagram of the testing system is illustrated. It will be appreciated that what is included in this figure is a vertical partial representation in the channel direction of the wafer structure of FIG. 1, in addition to a circuit schematic for the actual testing operation. The arrangement seen in FIG. 3 includes two large gate-controlled diodes A and B, but the arrangement is symmetrical, being defined by three diffused islands or regions D-1, D-2, and D-3, each being N+ conductivity type, the substrate being P-conductivity type. It will be understood that the symmetrical arrangement of the diffusions utilized in forming the islands D1, D2, and D3 accomplishes the purpose of making the thin oxide gate areas invariant to gate mask registration tolerance.

The gate-controlled diode structure, per se, which is a well known experimental tool, has been disclosed heretofore, and particular reference may be made to the work, "Physics and Technology of Semiconductor Devices", by A. S. Grove (John Wiley & Sons Inc.) especially to section 10.2 and 10.3 of that work.

Figure 4:
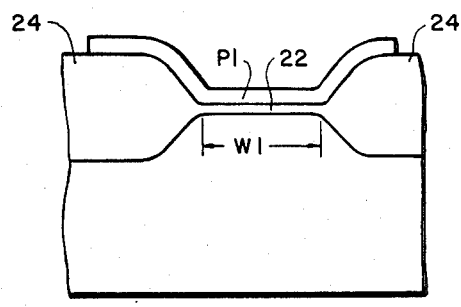
FIG. 4 is a vertical partial representation of the same wafer structure of FIG. 2, but perpendicular to the channel direction.

It is to be noted that the uniqueness of the testing structure 10 lies not only in the fact that two large gate-controlled diodes have been formed in the structure of FIGS. 2–4. Beyond that, a single diffused junction constitutes a common element within the testing structure; and the gates of the several diode devices are formed to have different perimeter-to-area ratios. As a result, the requisite isolation of leakage current components, and the desired minimum testing area, are achieved by the testing structure 10.

Thus, referring to FIGS. 2 and 3, two polysilicon layers P1 and P11 are illustrated. These layers, together with the thin oxide underlying them, define two separate gates. Each of these gates is fabricated so as to have approximately equal areas of this oxide underlying the respective polysilicon gate layers P1 and P11.

However, as will be seen by reference to FIGS. 2 and 3, the perimeter of the gate defined by the polysilicon layer P11 differs markedly from the perimeter of the first gate defined by P1. It should be noted particularly that the underlying thin oxide masking layer is generally designated 14 (see FIG. 3). The junctions defined by the respective islands of N+ conductivity type, that is, islands D1, D2, and D3 are designated 16, 18, and 20. Also, L1 and L2 designate respectively the lengths of the respective oxide regions 22 and 23, i.e. in the channel direction, which lengths correspond roughly to the distances between the junctions 16 and 18 and between the junctions 18 and 20. The relatively thick isolation or field oxide regions are designated 24.

It will be seen that the individual islands or pockets D1, D2, and D3 have metal contacts 26, 28, and 30 respectively; these islands are connected by the metal lines 32 extending therebetween. These lines 32 are shown schematically in the diagram of FIG. 3. Typically they are formed on the wafer, as seen in FIG. 2, as metal conductors or lands 32 having a width of approximately 10 micrometers.

The thin oxide region 22 (best seen in FIG. 3) bounded by the overlying polysilicon layer P1 of the first gate has selected layout dimensions (L1×W1) as indicated on FIGS. 3 and 4. The P1 layer itself has a slightly longer dimension, contact to this layer being made at a location above the thick isolation oxide layer 24 by way of the contacts 34 at either end (FIG. 2) of the P1 layer; connection thereto being achieved by the extended conductor or land 36 which connects with PAD 1 seen in FIG. 2.

It will be apparent that this first gate, comprising the P1 layer and its underlying oxide layer region 22, has a very small isolation-bounded perimeter region and therefore, the perimeter component of the gated surface leakage is negligible.

On the other hand, the thin oxide gate regions 23 under the other polysilicon layer P11 (which define the second gate) consist of 96 finger-like channels bounded by isolating field oxide in the length direction. Accordingly, these oxide regions or channels 23 lie under the fingers 40 which constitute the P11 layer of the second gate. To assure that all points under the thin gate regions remain in depletion simultaneously during gated diode measurements, the channel length is kept small.

It can, therefore, be appreciated that the second gate defined by the P11 layer has approximately the same thin oxide area as the first gate defined by the P1 layer; however, due to the large isolation-bounded perimeter region, a significant contribution to the leakage is made by these peripheral regions in the case of this second gate. Consequently, the difference in the magnitude of leakage currents obtained under test conditions between the two gate areas is primarily due to the isolation-bounded peripheral leakage. Effectively, then, these two contributions to leakage can be separated or isolated. Another way of saying this is that the process-induced defect leakage in the isolation area in forming semiconductor chips on a wafer can be separated from intrinsic material defects leakage contribution that occur (which are due to area-contributed components).

The total leakage currents from the two gated regions A and B have been estimated in accordance with standard design criteria; in a typical example, the total of leakage currents is approximately 80 pico amperes. What the testing structure of the present invention provides is the ability to separate the total into its two components. These components of the total leakage current were found to be contributed as follows: The small perimeter-to-area gate; that is, the gate defined by P1 contributed 32 picoamperes to the total leakage current; while the large perimeter-to-area gate, that is, the second gate defined by P11, contributed 48 picoamperes.

In implementing the testing structure, it will be seen that in FIG. 2, the two gates defined by P1 and P11 are brought out to the pads designated 1 and 4 respectively. It should be noted that transistor T2 (best seen in FIG. 3) is a source follower FET whose source, drain, and gate are brought out to pads 5, 6, and 7 respectively (FIG. 2).

In the testing procedure,—suitable positive voltage in the form of a ramp voltage 50 is applied by way of pad 2 to the gate of FET transistor T1. The result of this is the application of a fixed reverse voltage, $V_R$. Typically, this voltage is selected to be approximately 10 volts. It is of course, necessary that it be greater than the gate voltage $V_G$ plus the threshold voltage $V_T$.

The so-called Grove curves are taken for each of the first and second gates; that is to say, the change or variation of the reverse current due to the surface space charge region is determined by variation of the gate voltage. This involves holding one of the gate voltages for example, the second gate defined by the P11 polysilicon layer, at zero while the other gate, the gate defined by P1 layer, is accessed, that gate voltage being suitably varied.

Figure 5:
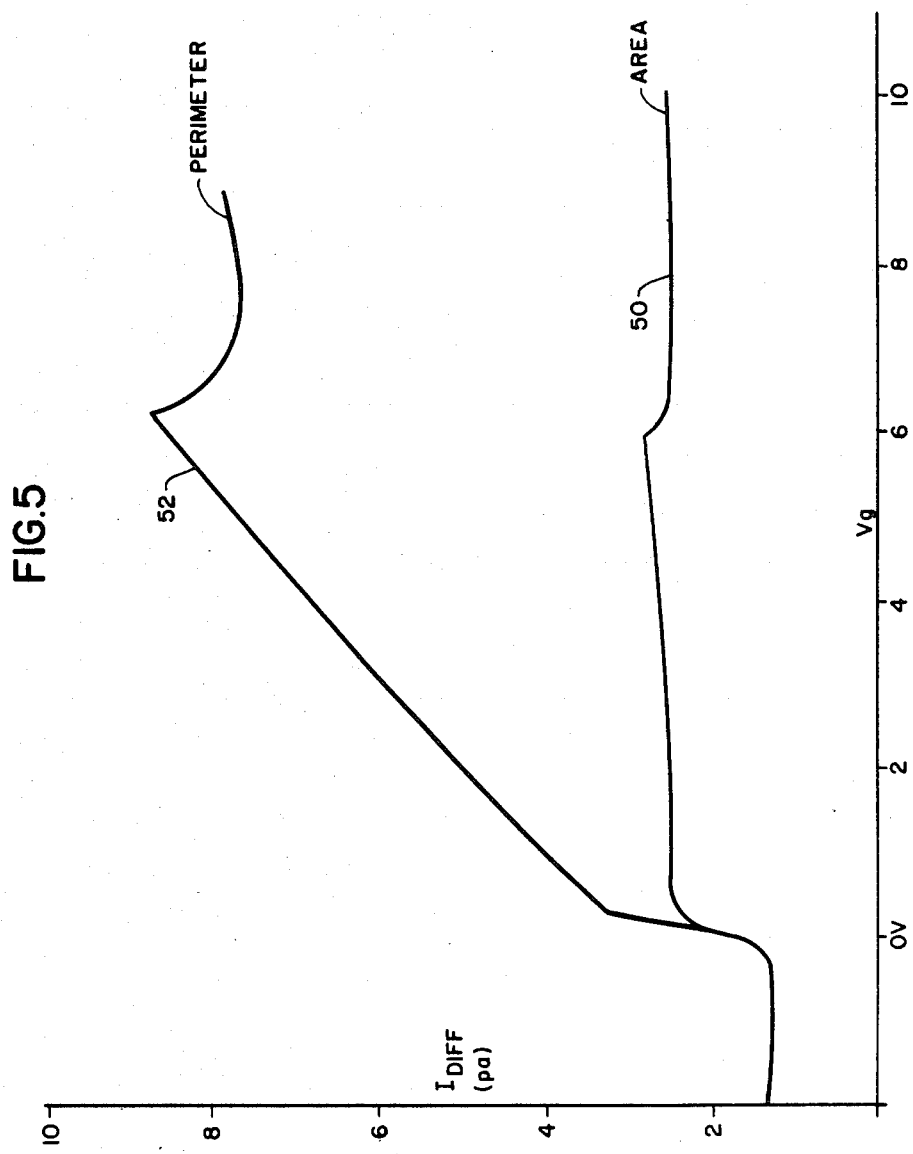
FIG. 5 is a graph illustrating so-called "Grove curves" as measured by the testing structure and technique of the present invention.

The curves that were actually measured by the testing structure of the present invention in one example are shown in FIG. 5. It would be seen that the reverse current for the N+P diode (the A diode controlled by the first or P1 gate) is plotted in the lower portion of that figure (curve 54). Accordingly, the leakage component, due to the area contribution (that is the area of the thin oxide region 22) is thereby obtained. In contrast, the other curve 56 of FIG. 5 depicts the variation of the reverse current as the gate voltage of the second gate is varied, while the first gate, defined by P1, is held at zero volts. This curve 56 defines the leakage component contributed by the large perimeter of the thick isolating field oxide 24.

It will be seen from both of the curves 54 and 56 that the results follow the example from the cited work by A. S. Grove, where the peak of reverse current is obtained when the depletion mode is effectuated such that recombination-generation centers at the oxide-silicon interface provide a very large contribution to the total current.

However, the notable thing about the curves of FIG. 5 herewith presented is that the capability is realized for separating entirely the leakage current component due to the small perimeter-to-area ratio of the first gate compared to the relatively large contribution due to the perimeter-to-area ratio of the second gate, it being recalled that preferably both gates were fabricated so that the thin oxide region has the same area for each of the gates.

It will be understood that the two polysilicon layers P1 and P11 are brought out to pads 1 and 4 respectively. It is at these pads that the appropriate gate voltage referred to is applied to achieve the Grove curves of FIG. 5. It should also be noted that transistor T-2 is a source follower FET whose source, drain and gate are brought out to pad 5, 6, and 7 respectively. During the gated diode measurements just described, pad 5 and pad 6 may be grounded and the diffusion islands D1, D2 and D3 will be accessed through pad 7. A substrate pad (not shown in the layout) has also been provided in an actual test site layer. Pad 2, which connects to the gate, and pad 3 which connects to the drain of FET T1, may be shorted to pad 7 if required.

In order to provide a dynamic leakage test, that is, to determine leakage as a function of time, the basic testing structure of FIG. 3 can be operated in a "RAM cell mode", so as to measure the perimeter/area ratio dependence on the leakage rate of the thin oxide gate regions. Thus, the FET T1 gate would be pulsed with a very short duration pulse 52 to charge the diffusion islands D1, D2, and D3 to a reference $V_R$ voltage by means of pad 3 (FIG. 2). In other words, the mode of operation is dynamic, involving the application of a short pulse, rather than a fixed gate bias supplied to T1.

The bias level, as before, must be chosen such that the reverse voltage $V_R$ across the N+P junctions—for example, the junction 16, is greater than the gate voltage $V_G$ minus the threshold voltage $V_T$ applied to the first gate defined by P1. Accordingly, a shallow potential well exists under the thin oxide gate region 22 for example. Consequently, the electrons generated in the storage gate region would be immediately swept and collected by the floating N+ diffusion region (D1). The potential change of the N+ diffusion, (assuming low diffused junction leakage confirmed by prior leakage measurements), as a function of time is a measure of the leakage rate in the storage region. This can be monitored through the source follower T2 operating in a linear transfer characteristic mode. For the same reasons as given before, when one gate, such as the gate defined by P1, is accessed, the other gate must be held at zero or negative potential, in order to have the surface underneath in an accumulated state so that any generation in the region can be neglected.

While there have been shown and described what are considered at present to be the preferred embodiments of the present invention, it will be appreciated by those skilled in the art that modifications of such embodiments may be made. It is therefore desired that the invention not be limited to these embodiments, and it is intended to cover in the appended claims all such modifications as fall within the true spirit and scope of the invention.

We claim:

1. A method of testing integrated circuits to determine or measure significant leakage currents, comprising the steps of:

forming, at a test site within a semiconductor wafer, a testing structure which includes (1) at least two gate-controlled diodes, the individual gates of which have markedly different perimeter-to-area ratios, and (2) an additional metallurgical junction common to said at least two gate-controlled diodes, said individual gates overlying one of said gate-controlled diodes and said common junction respectively;

connecting said two gate-controlled diodes and said common junction to a voltage source;

testing each of said gate-controlled diodes by alternately varying the gate voltage applied to one of said two diodes while maintaining the gate of the other diode at an appropriately low potential, so as to obtain the relationship between reverse current and gate voltage for each diode, whereby the perimeter contributed leakage current component is separated from the area contributed component.

2. A method as defined in claim 1, further comprising the steps of forming a thin oxide layer, regions of which define said gates, and forming an isolating boundary layer of thick oxide.

3. A method as defined in claim 2, further comprising forming a polysilicon layer to define each of said gates; the polysilicon layer of one of said gates being formed to have finger-like regions overlying said corresponding regions of said thin oxide layer.

4. A method as defined in claim 1, further comprising forming an amplifier at the test site; and performing dynamic testing of the current leakage rates by using said amplifier.

5. A method as defined in claim 1, in which said metallurgical junction is a diffused junction.

6. A method as defined in claim 1, in which said gates have equal areas.

7. A method as defined in claim 1, further comprising the step of forming said testing structure symmetrically to include three separate junctions; two of said junctions having associated gates so as to constitute said gate-controlled diodes.

8. Apparatus for testing integrated circuits to determine or measure significant leakage currents comprising:

a testing structure within a semiconductor wafer, said structure including at least two gate-controlled diodes, the individual gates of which have markedly different perimeter-to-area ratios, and (2) an additional metallurgical junction common to said at least two gate-controlled diodes, said individual gates overlying one of said gate-controlled diodes and said common junction respectively;

a voltage source, and means for connecting said voltage source to said two gate-controlled diodes and said common junction;

means for testing each of said gate-controlled diodes by alternately varying the gate voltage applied to one of said two diodes while maintaining the gate of the other diode at an appropriately low potential, so as to obtain the relationship between reverse current and gate voltage for each diode whereby the perimeter contributed leakage current component is separated from the area contributed component.

9. Apparatus as defined in claim 8, further comprising a thin oxide layer, regions of which define said gates, and an isolating boundary layer of thick oxide at the perimeter of said gates, whereby leakage current components due to the area contribution of said thin oxide regions are separated from the leakage current components due to said isolating boundary layer of thick oxide.

10. Apparatus as defined in claim 9, further comprising a polysilicon layer defining each of said gates, the polysilicon layer of one of said gates having finger-like regions overlying said corresponding regions of said thin oxide layer.

11. Apparatus as defined in claim 8, further comprising an amplifier at said test site.

12. Apparatus as defined in claim 8, in which said metallurgical junction is a diffused junction.

13. Apparatus as defined in claim 8, in which said gates have equal areas.

14. Apparatus as defined in claim 8, further comprising a symmetrical testing structure, including three separate junctions; two of said junctions having associated gates so as to constitute gate-controlled diodes.

* * * * *